US 6,879,479 B2

(12) United States Patent
Colombo et al.

(10) Patent No.: US 6,879,479 B2
(45) Date of Patent: Apr. 12, 2005

(54) CURRENT DETECTOR FOR SURGE ARRESTER DIAGNOSTIC AND OVERVOLTAGE ASSESSMENT IN HIGH VOLTAGE SUBSTATIONS

(75) Inventors: Enrico Colombo, Lissone (IT); Filippo Jaselli, Milan (IT); Evaristo Di Bartolomeo, Pescara (IT)

(73) Assignees: CESI Centro Elettrotecnico Sperimentale Italiano Giacinto Motta S.p.A., Milan (IT); Microelettrica Scientifica S.p.A., Milan (IT); T.E.R.NA. Trasmissione Elettricita Rete Nazionale S.p.A., Rome (IT)

( * ) Notice: Subject to any disclaimer, the term of this patent is extended or adjusted under 35 U.S.C. 154(b) by 212 days.

(21) Appl. No.: 10/151,823

(22) Filed: May 22, 2002

(65) Prior Publication Data
US 2002/0191360 A1 Dec. 19, 2002

(30) Foreign Application Priority Data
May 22, 2001 (IT) .................................. MI2001A001078

(51) Int. Cl.[7] .............................................. H02H 3/08
(52) U.S. Cl. ...................................................... 361/93.6
(58) Field of Search .............................. 361/93.6, 93.1, 361/39, 40, 117

(56) References Cited

U.S. PATENT DOCUMENTS

| | | | | |
|---|---|---|---|---|
| 5,006,846 A | * | 4/1991 | Granville et al. | ...... 340/870.28 |
| 6,104,590 A | * | 8/2000 | Schmidt | ...................... 361/118 |
| 6,392,401 B1 | * | 5/2002 | Cooke | ........................ 324/127 |
| 6,459,998 B1 | * | 10/2002 | Hoffman | ...................... 702/62 |

* cited by examiner

Primary Examiner—Michael Sherry
Assistant Examiner—James Demakis
(74) Attorney, Agent, or Firm—Young & Thompson

(57) ABSTRACT

An apparatus for sensing and measuring the HV surge arrester current includes two toroidal current transformers arranged coaxially with respect to the earth wire of the surge arrester, elements for sensing the current signals emitted by the transformers and for converting the current signals in digital signals, and elements for transmitting the digital signals to an information network and analog state signals by relay activation. The two toroidal current instrument transformers are associated, respectively, one to elements for sensing the normal leakage current, and the other to elements for sensing the impulsive current, the latter comprising a circuit (TRIGGER) discriminating between "switching" and "lightning" signals, in which the basis for discrimination is a signal duration threshold, of about 35 μs.

19 Claims, 2 Drawing Sheets

CURRENT DETECTOR FOR SURGE ARRESTER DIAGNOSTIC AND OVERVOLTAGE ASSESSMENT IN HIGH VOLTAGE SUBSTATIONS

TECHNICAL BACKGROUND OF THE INVENTION

The invention may be used in the field of high voltage (HV) electrical substations and, specifically, it integrates the function of the surge arresters, which are installed to protect the power transformers and the equipment.

PRIOR ART

Ever since long, the surge arresters for high voltage (HV) electrical substations may be supplied provided with devices for sensing and measuring the values of absorbed current, which integrate the primary function of the surge arresters which is to provide protection from overvoltages.

On this matter, current detectors, some of which are also the object of patents filed in the 1980s, may be found on the market, which can:

monitor the leakage current of the surge arrester in standard working conditions, and count the number of overvoltage events, i.e. the number of the voltage impulses that the surge arrester happens to absorb in service.

The devices currently available can only provide limited quantitative information, since they cannot provide the analysis of the overvoltages, nor, in particular, can they discriminate between the different types of overvoltage, that is, whether they are due to atmospheric events or switching operations. Furthermore, the information available may only be acquired by going directly on site at the place of installation of the devices and reading the data stored there.

OBJECT OF THE INVENTION

The main object of the present invention is to propose a sensing and measuring apparatus, which can facilitate the monitoring of the required information. Such an object is achieved by means disclosed below.

Another important object of the present invention is to propose a sensing and measuring apparatus, which can acquire qualitative information on the line voltage and, in particular, discriminate the type or the nature of the overvoltage. Such an object is achieved by means disclosed below.

Furthermore, the apparatus according to the present invention integrates in one item the functions mentioned above.

More specifically, the apparatus according to the present invention achieves the objects of:

a) monitoring the functional state of the surge arrester, producing an alarm signal whenever anomalous values are detected;

b) providing a valid alternative to the "discharge counters" known in the art, which in some cases find no use because of their scarce reliability and of the difficulty in interpreting their data;

c) providing supplementary information on the station overvoltages, in particular, with the possibility to discriminate their cause;

d) making all such information available to a remote, centralized observation place, in practice, making it possible to automatically and continuously monitor the information regarding the exceeding of the functional state thresholds of the surge arrester, and the occurrence of overvoltages (which today is only carried out by means of periodic checks).

BRIEF DESCRIPTION OF THE DRAWINGS

Further characteristic features and advantages of the present invention will emerge in the following detailed description of a preferred embodiment, provided by way of a non-limiting example, and illustrated in the accompanying drawings, in which.

DETAILED DESCRIPTION OF AN EMBODIMENT

The present invention consists of an electronic apparatus that senses the signal of the current absorbed by the surge arrester, and software that analyses such a signal. As a result, logic and analog states are produced, which may be remotely transmitted for immediate acquisition.

Figure 1:
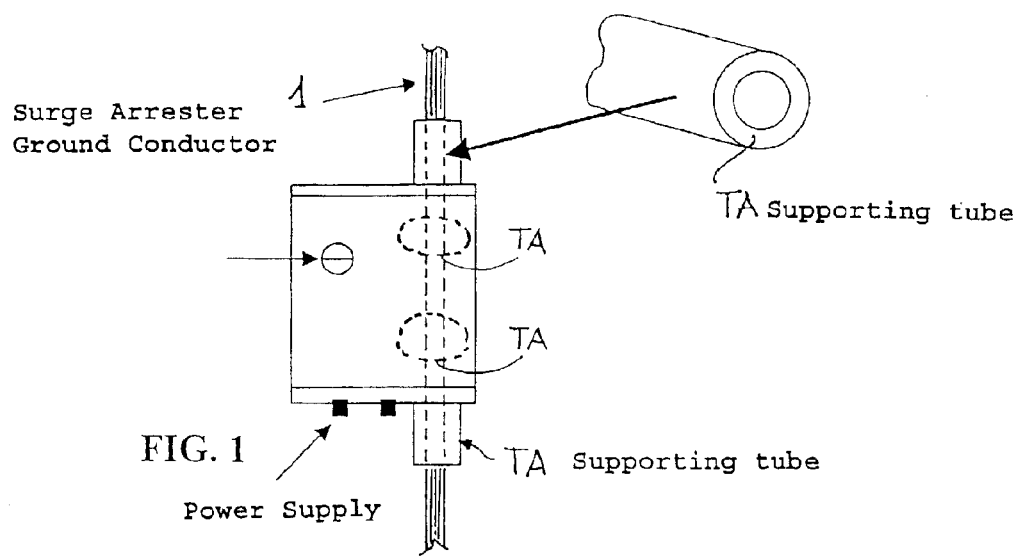
FIGS. 1 and 2 illustrate how to fit the device according to the present invention on the metal support of the surge arrester, in a front elevation view and side view respectively.
Figure 2:
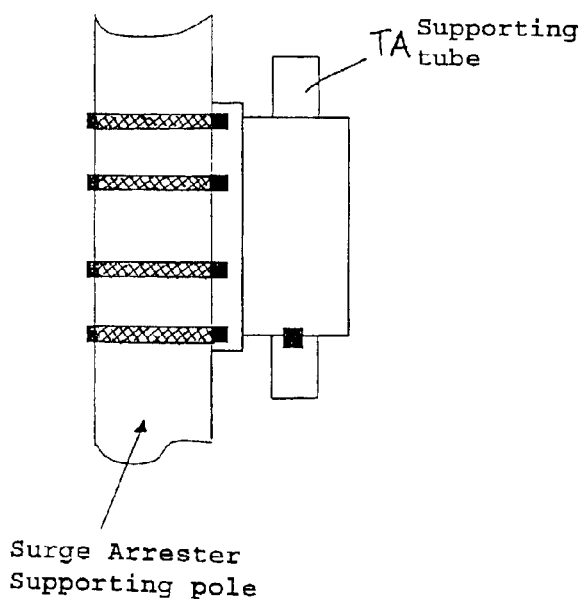

Contrary to the devices known in the prior art, which require the insertion of elements in series with the earth wire (current shunt) for acquiring the measure signal, the apparatus according to the present invention may be installed on the support of the surge arrester, without any interposition of elements in series with the earth wire, for example, in the way shown in FIGS. 1 and 2.

Figure 3:
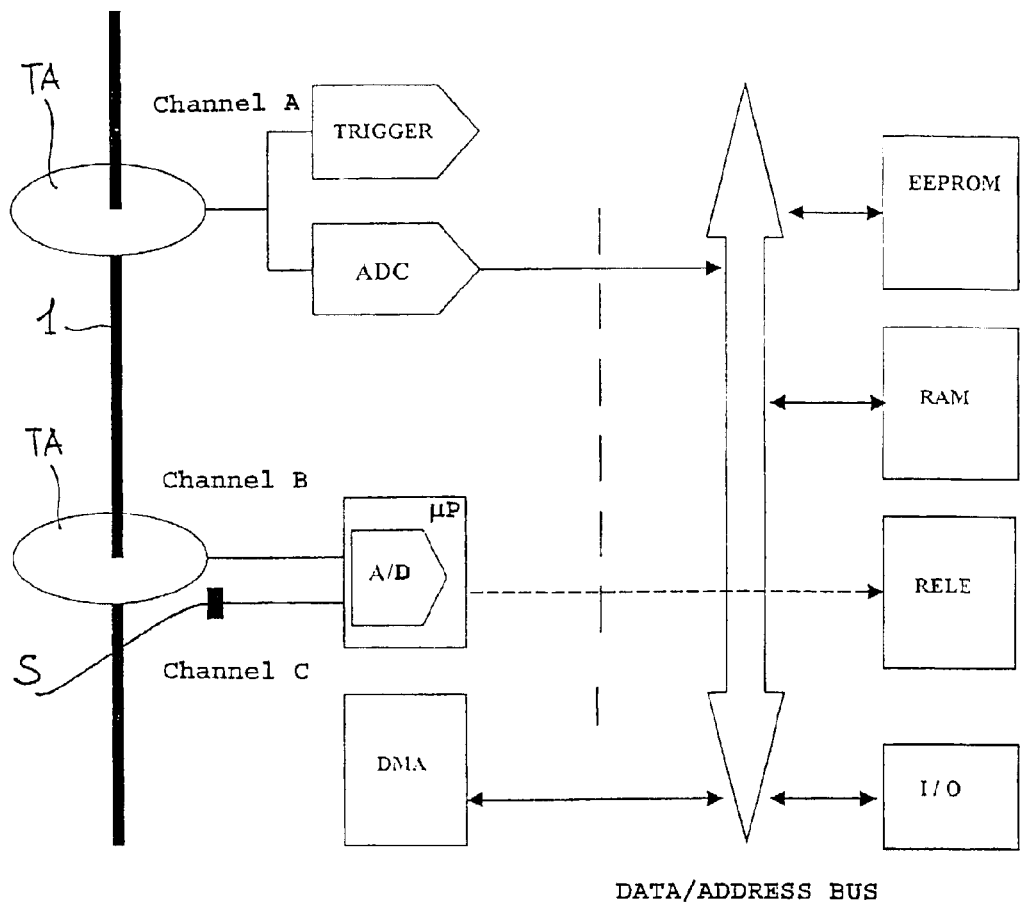
FIG. 3 schematically illustrates a functional diagram of the apparatus according to the present invention.

The sensing and measuring apparatus according to the present invention is shown schematically in FIG. 3. It comprises two toroidal current measure transformers TA, which surround the connection of the surge arrester to earth, in which the surge arrester current flows, it being arranged, as known, in series with the surge arrester, and an electronic circuitry to process and acquire the signal.

To these transformers TA are connected, respectively, a channel A measuring the impulsive current, and a channel B measuring the leakage current of the surge arrester. A temperature sensor is associated to a channel C.

The two transformers TA, schematically represented by the tubular body shown in FIG. 3, have a ratio of transformation that allows them to measure currents of the order of-tenths of microamperes and some hundred kiloamperes respectively, for both polarities.

Channel A comprises a trigger, which has the function of activating the process of acquisition of the impulsive events. These events are classified as atmospheric or switching operations respectively, according to their duration, and taking as a discrimination threshold a very short time, for example, 35 $\mu s$, below which the events are classified as "atmospheric", and above which the events are classified as "switching operations".

An analog-digital converter ADC processes the signals corresponding to these impulsive events and transmits them to a DATA-ADDRESS bus.

Channel B comprises a microprocessor $\mu P$ and an analog-digital converter A/D of the normal current. To the channel B is associated a channel C, which carries a temperature signal coming from the sensor S, and senses the temperature of the environment. These signals, processed in digital form, are subsequently sent to the DATA-ADDRESS bus.

A controller DMA controls the flow of data towards the temporary memory storage RAM for the transition of the data coming from the converter ADC, and to the non-volatile memory EEPROM for permanent memorization of the data respectively.

A pair of relays RELE' switch off when predefined thresholds of impulsive currents and leakage current of the surge arrester, respectively, are exceeded.

Finally, a serial port I/O makes it possible to connect it to an external data transmission network and/or to a PC for further processing.

The relevant functional characteristic features of the above apparatus are as follows:

measurement of the normal leakage current in the range of 10 $\mu$Ap–10 mAp. The effective, peak and third harmonic values are measured at predefined and memorized intervals. The sampling frequency is 0.6 kHz, and the measuring time is 100 ms;

measurement of the switching-like impulse, in the range of ±100 kAp. The sampling frequency of the signal is 7 kHz, the resolution is <50 A, and the registration duration is 35 ms;

measurement of the lightning-like impulse, in the range of ±100 kAp. The sampling frequency of the signal is 3.3 MHz, the resolution is <50 A, and the registration duration is 77 $\mu$s;

temperature measurement;

activation of two independent relays when thresholds are exceeded, associated respectively to the normal leakage current and to the impulsive current;

non-volatile memory support for the measurement data and the registration of the events, represented by a flash technology chip (EEPROM);

registration of the data regarding the impulsive phenomena through quick ADC, DMA controller and RAM. In this way it is possible to acquire data relative to quick transients, with peak time of the order of a microsecond ($\mu$s). This represents a necessary basis for a subsequent analysis of the overvoltage;

microprocessor with extended-bus configuration, that is, the same lines HW are used both as a data bus and as an address bus, and working in "idle" state in the absence of events (low consumption);

two electronic boards produced with traditional technology and in SMD and components that can operate in a range between –25° and +55°;

auxiliary supply unit by means of a 220/220 V transformer with 10 kV insulation, a line filter at 50 Hz and an adapter 220/12 Vcc. Alternatively, power may be supplied through a solar panel and a storage battery;

external visualization through LED diode, which indicates the presence of supply in the circuit;

container in stratified polyester material, reinforced with fibre glass, autoextinguishing, for external installation, with protection degree IP 66. A suitable thermostat-controlled heating system can be provided in the container, to enable it to function at temperatures lower than –25°.

The apparatus therefore can:

follow the variation of the power frequency leakage current, observing its peak value, and produce a state signal by means of a relay that indicates when a predefined threshold is exceeded;

discriminate between lightning and switching impulses;

remotely transmit in real time, for example, to the installation manager, a signal corresponding to this information or at least to part of it, to inform about the occurrence of the events.

What is specified above may constitute an active interface between the field and the control workstation.

Interfacing with the apparatus is also possible by means of a PC with "Windows 95/98" software and a RS 485 port. If desired, this physical support may be converted in RS 232, or in an optical support.

The apparatus is provided with two software programmes, respectively, for interfacing with the PC and for managing the data recorded:

a programme for interfacing the apparatus with the PC makes it possible to download the data recorded into the PC, and to initialise the apparatus interpreting the respective parameters.

a second programme is specifically devised to convert the measurements taken into suitable diagrams, and to facilitate the visibility and interpretation of the data.

The sensing and measuring apparatus according to the present invention—which is used as a device associated to the HV surge arresters—integrates the diagnostic function of the surge arrester and the informative function on the effectiveness of protection from overvoltages. It offers, with respect to what is already available on the market, the advantage of a processing of the surge arrester current, which makes it possible to realize when the attention thresholds of the normal values are exceeded and an overvoltage occurs, also discriminating its type and thus its origin (internal or external, respectively) with regard to the electric system.

Contrary to the known devices, which require reading of the data in the place of installation, hence losing the immediacy of the information, the apparatus according to the invention, using remote transmission of state signals, makes the required information available in real time and makes the permanent storage of all the acquired and produced data possible. It is understood, however, that the invention must not be regarded as being limited to the particular embodiment which is illustrated above and which is a merely non-limiting example of the scope of the invention, but that different variations are possible, all of which within the grasp of a person skilled in the art, without thereby departing from the protective scope of the said invention, as defined by the claims which follow.

What is claimed is:

1. Apparatus for sensing and measuring conduction current of high voltage surge arresters and for evaluating impulsive voltage, comprising:

first and second toroidal current transformers arranged coaxially around an earth wire of a high voltage surge arrester, the first toroidal transformer associated with means for sensing normal leakage current signals, the second toroidal transformer associated with means for sensing impulsive current signals; and means for discriminating between the normal leakage current signals and the impulsive current signals based on a signal duration threshold.

2. The apparatus of claim 1, wherein the signal duration threshold is about 35 $\mu$s.

3. The apparatus of claim 1, further comprising:

a trigger circuit, associated with an output channel of the second toroidal transformer, the trigger circuit dividing output channel signals into switching and lightning signals.

4. The apparatus of claim 2, further comprising:

a trigger circuit, associated with an output channel of the second toroidal transformer, dividing output channel signals into switching and lightning signals.

5. The apparatus of claim 1, further comprising:
means to transform the current signals of the first and second toroidal transformers into digital signals; and
means to transmit the digital signals to an information network.

6. The apparatus of claim 4, further comprising:
means to transform the current signals of the first and second toroidal transformers into digital signals; and
means to transmit the digital signals to an information network.

7. Apparatus for sensing and measuring conduction current of high voltage surge arresters and for evaluating impulsive voltage, comprising:
an electronic apparatus that senses a signal of current absorbed by a high voltage surge arrester as measured through an earth wire of the surge arrester; and
software that analyses such the sensed signal to produce states for immediate acquisition through remote transmitted,
the electronic apparatus comprising
first and second toroidal current measuring transformers each mountable coaxially with respect to the earth wire of the surge arrester, and
an electronic circuitry to acquire and process signals acquired by the first and second transformers,
the electronic circuitry including i) a first means for sensing normal leakage current signals of the surge arrester, the first means being associated with the first toroidal transformer, ii) a second means for sensing impulsive current signals of the surge arrester, the second means being associated with the second toroidal transformer, and iii) a discriminating means for discriminating between the normal leakage current signals and the impulsive current signals based on a signal discrimination duration threshold.

8. The apparatus of claim 7, wherein, the first and second transformers have a ratio of transformation allowing the first transformer to measure currents of the order of-tenths of microamperes and the second transformer to measure currents of the order of hundred kiloamperes, for both polarities.

9. The apparatus of claim 7, further comprising:
a trigger associated with the second means, the trigger acting to activate acquisition of impulsive events including atmospheric or switching operations, according to their event duration and the signal discrimination duration threshold.

10. The apparatus of claim 9, wherein the signal discrimination duration threshold is in the range of 35 $\mu s$, such that events lasting less 35 $\mu s$ are classified as atmospheric, and events lasting more than 35 $\mu s$ are classified as switching operations.

11. The apparatus of claim 9, wherein events lasting less than the threshold are classified as atmospheric, and events lasting more than the threshold are classified as switching operations.

12. The apparatus of claim 11, wherein the second means further comprises:
a first analog-digital converter connected to the second transformer and the trigger, the first converter processing the signals corresponding to the impulsive events and transmitting the processed impulsive events' signals to a DATA-ADDRESS bus.

13. The apparatus of claim 12, wherein the first means further comprises:
a microprocessor and a second analog-digital converter connected to the first transformer, the second convertor processing the normal leakage current signals and transmitting the processed leakage current signals to the DATA-ADDRESS bus.

14. The apparatus of claim 7, wherein,
the first transformer measures the normal leakage current in a range of 10 $\mu A$ through 10 mA, with effective, peak and third harmonic values being measured at predefined and memorized intervals with a sampling frequency of 0.6 kHz, and a measuring time of 100 ms, and
the second transformer measures the impulse current signals over a range of ±100 kA with a sampling frequency of 7 kHz, a resolution of <50 A.

15. The apparatus of claim 9, where in the signal discrimination duration threshold is set such that events lasting less than 35 $\mu s$ are classified as atmospheric events, events lasting more than 35 $\mu s$ and less than 77 $\mu s$ are classified as switching operations, and events lasting 77 $\mu s$ are classified as lightning events.

16. Apparatus for sensing and measuring conduction current of high voltage surge arresters and for evaluating impulsive voltage, comprising:
first and second toroidal current measuring transformers each mountable coaxially with respect to an earth wire of a high voltage surge arrester;
a first means for sensing normal leakage current signals of the surge arrester, the first means being associated with the first toroidal transformer;
a second means for sensing impulsive current signals of the surge arrester, the second means being associated with the second toroidal transformer; and
a discriminating means for discriminating between the normal leakage current signals and the impulsive current signals based on a signal discrimination duration threshold,
wherein events lasting less than the threshold are classified as atmospheric events and events lasting more than the threshold are classified as switching operations.

17. The apparatus of claim 16, wherein, the first transformer measures currents of the order of tenths of microamperes and the second transformer measures currents of the order of hundreds of kiloamperes.

18. The apparatus of claim 17, wherein,
the second means further comprises
a trigger associated with the second means, the trigger acting to activate acquisition of impulsive events including atmospheric or switching operations, according to their event duration and the signal discrimination duration threshold, and
a first analog-digital converter connected to the second transformer and the trigger, the first converter processing the signals corresponding to the impulsive events and transmitting the processed impulsive events' signals to a DATA-ADDRESS bus, and
the first means further comprises
a microprocessor and a second analog-digital converter connected to the first transformer, the second convertor processing the normal leakage current signals and transmitting the processed leakage current signals to the DATA-ADDRESS bus.

19. The apparatus of claim 17, wherein,
the signal discrimination duration threshold is set such that events lasting less 35 $\mu s$ are classified as atmospheric events, events lasting more than 35 $\mu s$ and less than 77 $\mu s$ are classified as switching operations, and events lasting 77 $\mu s$ are classified as lightning events.

* * * * *